United States Patent [19]

Baruch et al.

[11] 4,004,950
[45] Jan. 25, 1977

[54] METHOD FOR IMPROVING THE DOPING OF A SEMICONDUCTOR MATERIAL

[75] Inventors: Pierre Baruch, Paris; Joseph Borel, Echirolles; Joël Monnier, Antibes, all of France

[73] Assignees: Agence Nationale de Valorisation de la Recherche (ANVAR), Neuilly; Commissariat a l'Energie Atomique, Paris, both of France

[22] Filed: Jan. 10, 1975

[21] Appl. No.: 539,983

[30] Foreign Application Priority Data

Jan. 10, 1974 France .............. 74.00774

[52] U.S. Cl. .............................. 148/1.5; 357/91
[51] Int. Cl.² ............................ H01L 21/263
[58] Field of Search ............... 148/1.5; 357/91
[56] References Cited

UNITED STATES PATENTS

| 3,383,567 | 5/1968 | King et al. ............. 148/1.5 X |
| 3,513,035 | 5/1970 | Fitzgerald et al. ....... 148/1.5 |
| 3,515,956 | 6/1970 | Martin et al. ........... 148/1.5 X |
| 3,622,382 | 11/1971 | Brack et al. ........... 148/1.5 X |
| 3,756,862 | 9/1973 | Ahn et al. ............. 148/1.5 |

OTHER PUBLICATIONS

Nelson et al., "Radiation-Enhanced Diffusion of Boron in Silicon", Appl. Phy. Let., Oct. 15, 1969, vol. 15, No. 8, pp. 246, 248.

Primary Examiner—C. Lovell
Assistant Examiner—J. M. Davis
Attorney, Agent, or Firm—Lane, Aitken, Dunner & Ziems

[57] ABSTRACT

In a first step, the semiconductor material is doped in a known manner with impurities having a given conductivity type and a given concentration profile. In a second step, the material is maintained at a high temperature, bombarded with a beam of particles which are accelerated with a given energy so as to penetrate into the crystal during a predetermined time interval. The resultant migration of impurities produces an increase in the impurity concentration irrespective of the sign of the initial concentration gradient within a zone adjacent to the zone of stopping of the particles.

21 Claims, 15 Drawing Figures

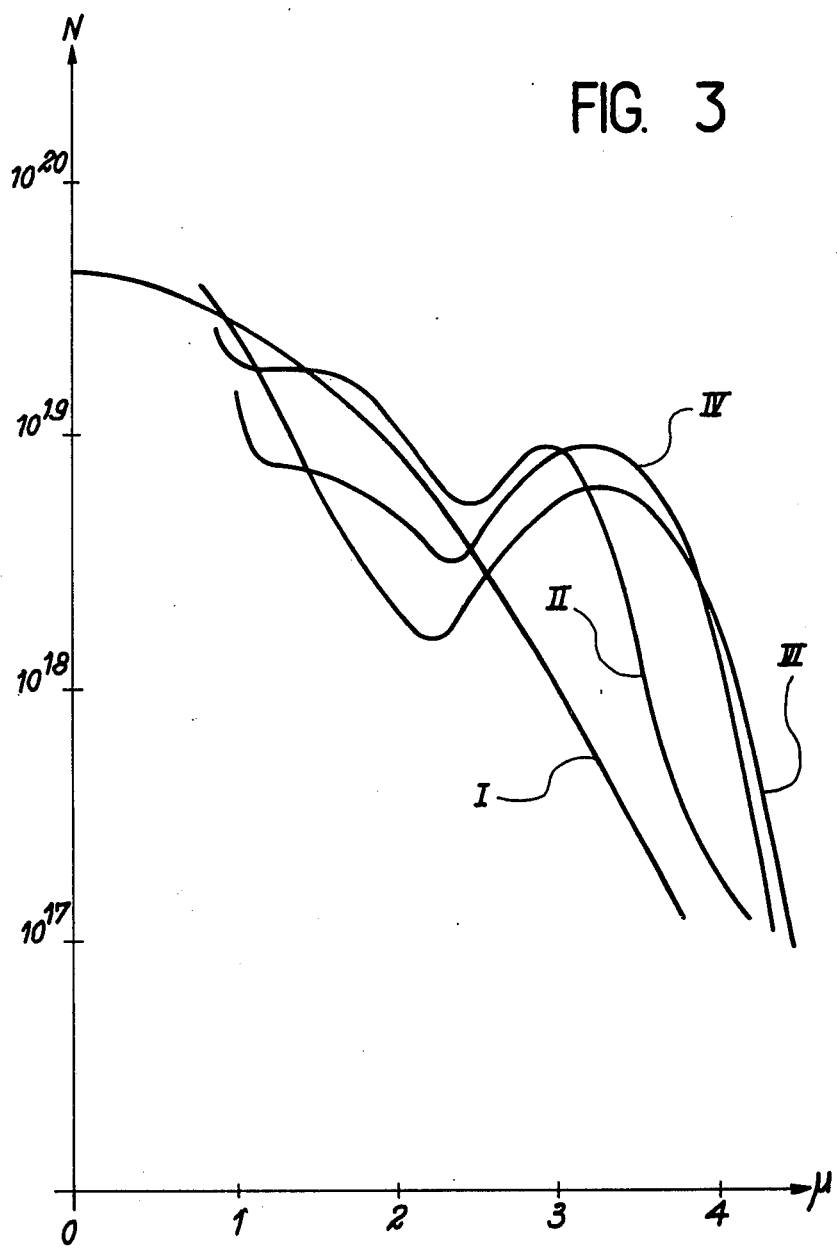

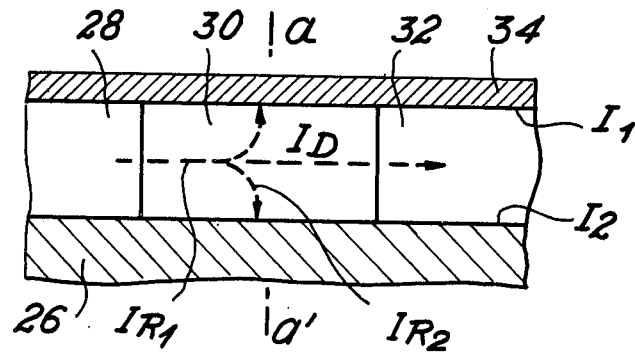
FIG. 7a
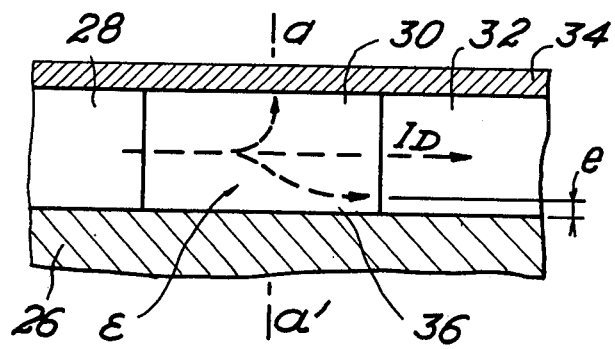
FIG. 7'a
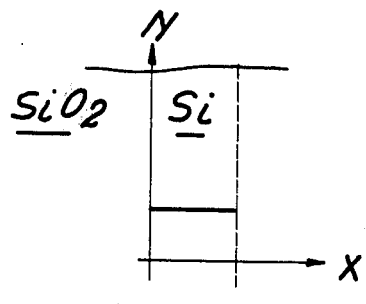
FIG. 7b
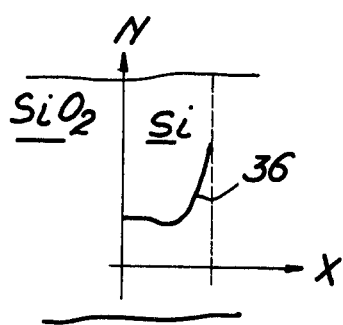
FIG. 7'b

METHOD FOR IMPROVING THE DOPING OF A SEMICONDUCTOR MATERIAL

This invention relates to a method for improving the doping of a semiconductor material.

In more exact terms, the invention is concerned with a method of doping which makes it possible to obtain a final concentration profile for impurities of a given type of conductivity which it was impossible or very difficult to obtain by known methods.

A number of different techniques have already been widely employed for doping a single crystal with semiconducting material. Among these can be mentioned in particular the high-temperature diffusion technique, ion implantation and "accelerated diffusion."

Diffusion is the oldest of these methods and is familiar to anyone versed in the art. It is known that this method makes it possible to obtain a concentration profile for diffused atoms such that the concentration decreases in inverse ratio to the distance from that face of the single crystal at which the diffusion has been performed. In this method, the crystal must also be subjected to a heat treatment at high temperature. In order to produce an advantageous result, it is necessary to attain temperatures at least equal to 1000° C, thus modifying the crystal structure. In particular, if a number of successive diffusions are necessary in order to obtain the different zones of the desired component, the successive heating operations reduce the definition of each doping and have a tendency to result in fusion of the structures obtained during previous stages.

The methods of ion implantation are also well known. The ionized impurity atom (boron, phosphorous and the like) is accelerated with a known energy in order to bombard the crystal and become embedded in this latter at a predictable depth. Use is accordingly made of focused ion beams accelerated to a kinetic energy of the order of 10 KeV to 2 MeV. This implantation causes the displacement of a certain number of atoms of the crystal and the formation of microscopic damaged regions. For this reason, the implantation proper is followed by an annealing operation at a temperature below that which is employed in the gaseous diffusion process. These methods also result in a concentration profile for implanted impurities which decreases uniformly and progressively as the distance increases from that face of the crystal in which the implantation has been performed (if the surface layer is excluded).

In order to obtain a buried layer, it is necessary to utilize very high energies and the layer thus formed is of small depth.

The third method is that of accelerated diffusion. This technique is described in French patent Application No. 72 43292 of Nov. 29, 1972 in respect of "Improved method of diffusion by protons and semiconductor devices obtained by said method."

This method consists essentially in displacing a p-n junction within a semiconducting pellet by bombarding this latter with an accelerated ion beam, the pellet being maintained at a high temperature in order to induce lattice vacancies within the region of the second type of conductivity.

This method makes it possible to "flatten" or "spread" the concentration profile for impurities of one of the two doping substances but a decreasing concentration as a function of the depth of penetration is always obtained unless a buried layer has previously been formed either by implantation or successive epitaxial growths.

It is in fact desirable in some applications to produce a rise in the concentration profile for an impurity of a given type at a given depth within the semiconductor crystal.

The precise object of the present invention is to provide an improved method of doping which makes it possible to obtain this result.

The method essentially consists in a first step in doping said material in the known manner with said impurities which have a given concentration profile and, in a second step, in maintaining said material at a high temperature, in bombarding said material at least once with a beam of given intensity of particles accelerated with a given energy which is sufficient to penetrate into the crystal during a predetermined time interval so as to obtain migration of the impurities resulting in an increase in the impurity concentration irrespective of the sign of the initial concentration gradient (positive, negative or zero) within a zone adjacent to the zone of stopping of the particles.

In accordance with another characteristic feature, the energy of the beam of non-doping ions is such that the zone of stopping of said particles is adjacent to the region in which it is desired to obtain a rise in the impurity concentration.

In accordance with a second characteristic feature, the fluence of the beam of non-doping particles is such that the desired value of rise in concentration is obtained.

When protons are employed, the acceleration energy is preferably comprised between 200 and 700 KeV. The temperature to which the semiconductor material is heated is of the order of 700° to 1000° C. The fluence of the beam of bombardment particles is advantageously within the range of $10^{15} p/cm^2$ to $10^{19} p/cm^2$.

This invention also relates to the application of the method described in the foregoing to the fabrication of semiconductor components, a number of different examples of which will be given in the following description.

A clearer understanding of the invention will in any case be gained from the following description of a number of modes of application of the method according to the invention which are given by way of example without any limitation being implied, reference being made to the accompanying figures, in which :

FIGS. 2, 3 and 4 show the curves which illustrate the irradiation effect according to the invention on a semiconductor material having non-uniform doping ;

Figure 8A:
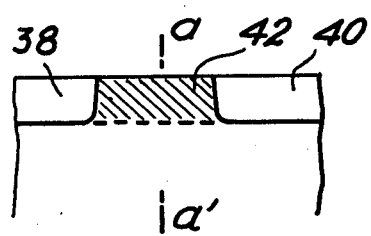
Figure 8B:
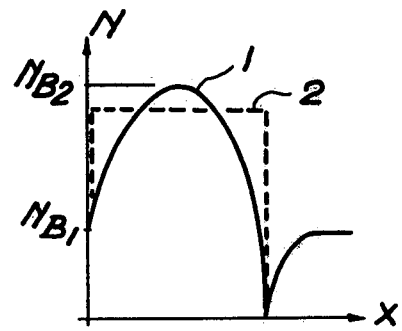
Figure 9A:
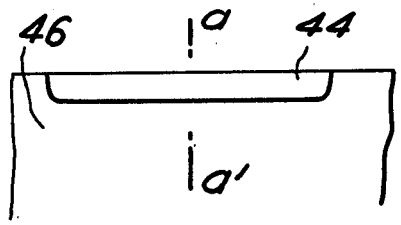
Figure 9C:
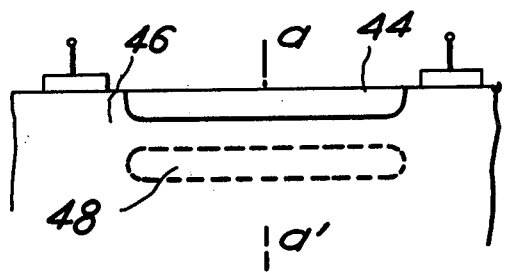
Figure 9B:
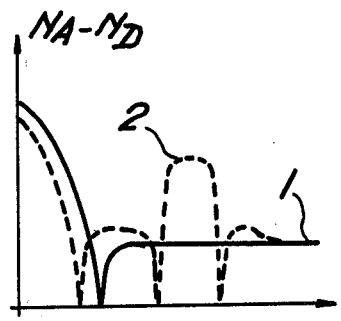

FIGS. 7a, 7'a, 7b, 7'b show one example of application of the method according to the invention to the fabrication of diodes on an insulating substrate ;

FIGS. 8a and 8b show one example of fabrication of depletion-type MOS transistors ;

FIGS. 9a, 9b and 9c show one example of fabrication of a field-effect transistor with buried electrode.

As has been stated earlier, the improved method of doping in accordance with the invention consists in a first step of doping the semiconductor crystal (for example a silicon crystal) by known means with a view to forming a p-n junction.

By way of example, the starting material can be a substrate of p-type silicon in which is formed an n-type region. This n-type region can be obtained by any known means such as ion implantation or diffusion. The portions of the substrate in which it is desired to produce a modification of the n-type impurity concentration profile are subjected to a beam of non-doping charged particles such as protons or molecular ions H$^+$, these regions being limited by a mask. During this operation, the semiconductor substrate is maintained at a relatively high temperature of the order of 850° C.

In this method, a number of different physical values come into consideration : the concentration profile and the dose of initial doping impurities ; the time of irradiation of the substrate and the flux of the beam employed for the irradiation, the energy of the beam and the nature of the particles employed for the irradiation.

It should at once be made clear that the particle flux employed for the irradiation is measured in p/cm$^2$/s and that, if a given flux is applied to the substrate for a given period of time, there is a fluence expressed in p/cm$^2$ which gives the dose applied per cm$^2$. This is the beam fluence and reference will be made to this value rather than the flux in the following description.

The results obtained by subjecting previously doped silicon substrates to irradiation in accordance with the present invention will now be described.

EXAMPLE 1

This example is concerned with a homogeneous sample.

This sample which had been doped by boron during the growth had a nominal resistivity of 0.0012 ohm-cm, therefore a concentration of $10^{20}$ B/cm$^3$.

Irradiation was carried out with a proton beam having an energy equal to 250 keV with a current density in the vicinity of 6 $\mu$A/cm$^2$ (3.7 × 10$^{13}$ p/cm$^2$/s) for a period of 3 hours and 8 minutes ; the fluence was therefore 4 × 10$^{17}$ p/cm$^2$.

The temperature of the sample was maintained at 860° C ; taking into account the heating-up and interruptions of the beam, the duration of the heat treatment at this temperature is equivalent to 13000 s under a vacuum which was higher than 10$^{-6}$ torr.

The irradiated zone was a circle 6.1 mm in diameter as determined by an opening in a tantalum mask applied against the sample.

Figure 1:
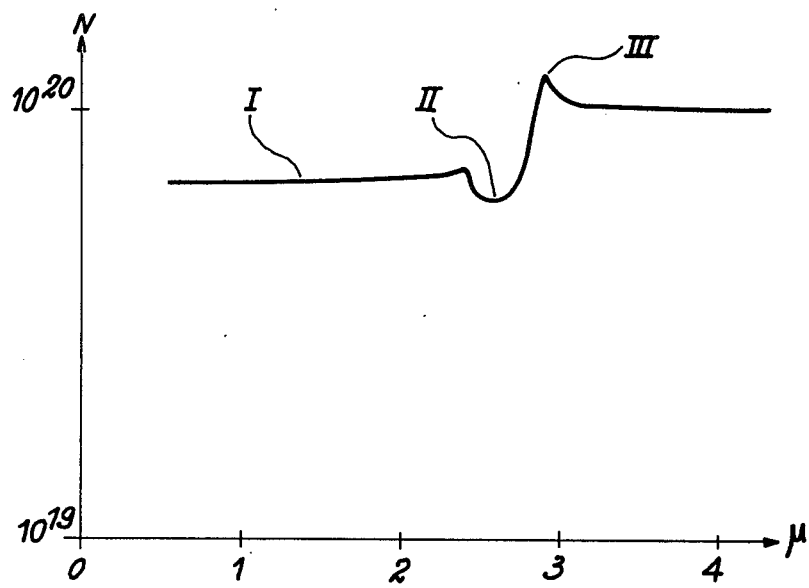
FIG. 1 shows the curves which illustrate the irradiation effect according to the invention on a homogeneous semiconductor material.

After irradiation, the boron concentration profile shown in FIG. 1 reveals considerable differences with respect to the initial uniform profile. The depths in microns have been plotted as abscissae and the impurity concentrations after irradiation have been plotted as ordinates.

It is especially noticeable that a level stage or plateau I at 7 × 10$^{19}$ is followed by a boron depletion II starting from 2.4 $\mu$m, which is in turn followed by an enrichment peak III at 1.2 × 10$^{20}$ B/cm$^2$ at a depth of 2.95 $\mu$m. The concentration then reverts to a uniform value in the vicinity of 10$^{20}$ B/cm$^3$. The projected path of protons of 250 keV energy is 2.5 $\mu$m.

EXAMPLE 2

This example is concerned with a non-homogeneous prediffused sample.

The n-type silicon substrate (resistivity of 5 ohm-cm) was subjected to a predeposition of boron in carrier gas for a period of 180 minutes at 1150° C. This treatment results in a nominal surface concentration $C_s = 2 \times 10^{20}$ cm$^{-3}$ and a distribution represented approximately by the relation :

$$C = C_s \, erCc \frac{x}{2\sqrt{D_o t_o'}} \text{ with } 2\sqrt{D_o t_o'} = 1.6 \, \mu$$

Figure 2:
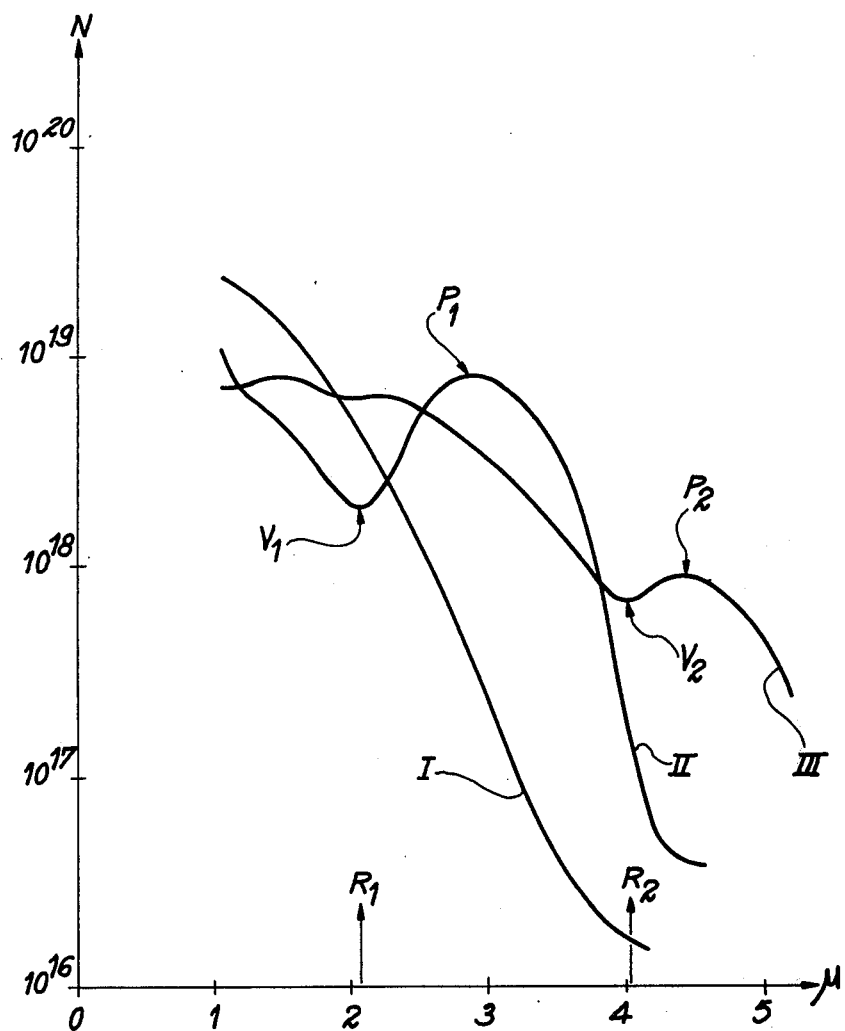

This profile is represented by curve I of FIG. 2. The initial junction is located at 3.7 $\mu$m.

Curve II represents the new concentration profile after an irradiation in accordance with the invention.

A proton beam of 250 keV energy was employed for a period of 2 hours. The fluence was of the order of 4 × 10$^{17}$ p/cm$^2$. The temperature was of the order of 880° C. The normal penetration of protons (R$_1$) was 2.4 $\mu$m. It is observed that a peak P$_1$ was obtained in respect of a depth of 2.8 $\mu$m and a "valley" V$_1$ in respect of a depth corresponding substantially to R$_1$.

Curve III illustrates the result obtained under the same experimental conditions but with an energy of 400 keV, in which case the value of R$_2$ was 4.3 $\mu$m. It is observed that there is present on this curve a peak P$_2$ for a depth of 4.5 $\mu$m and a "valley" V$_2$ corresponding substantially to R$_2$. It is therefore apparent that the acceleration energy makes it possible to adjust the depth of the peak, that is to say the position of the rise in the concentration gradient, to a value slightly higher than that of the corresponding depth of stopping of the protons.

EXAMPLE 3

The samples were n-type silicon substrates having a resistivity within the range of 0.7 to 1.2 ohm-cm and prediffused with boron. These samples were irradiated at 880° C by protons of 250 keV energy with different fluences. The results obtained by these different irradiations have been recorded in FIG. 3.

Curve I of FIG. 3 represents the initial profile prior to irradiation. Curve II gives the profile obtained after irradiation with a fluence of 10$^{17}$ p/cm$^2$ ; curve III corresponds to a fluence of 4 × 10$^{17}$ p/cm$^2$, and curve IV has a fluence of 6 × 10$^{17}$ p/cm$^2$.

It is observed that the minimums of curves II, III and IV correspond substantially to the same depth (2.4 $\mu$m), which is normal since the protons have the same energy in all three cases. On the contrary, it is observed that the width of the peak increases with the fluence and that the peak/valley ratio also increases with the fluence. The total quantity of boron atoms which are displaced towards the disordered region therefore increases with the fluence.

EXAMPLE 4

Figure 4:
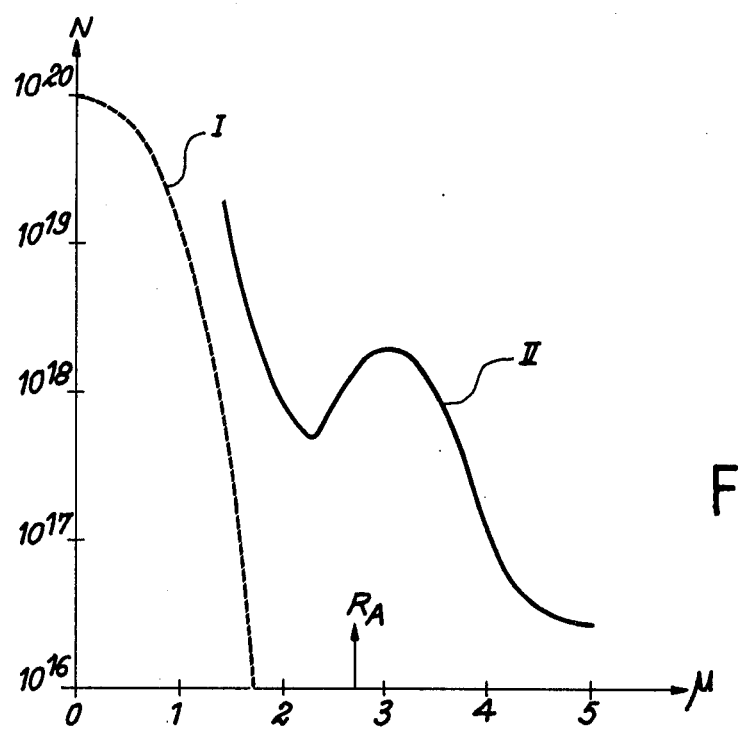

There is employed in this example an n-type silicon substrate prediffused with p-type impurities with a depth of junction of 1.7 $\mu$m. The irradiation takes place at 850° C with a fluence of 4 × 10$^{17}$ p/cm$^2$ and an energy of 250 keV (FIG. 4). As at the outset, the depth of prediffusion (curve I) is only 1.7 $\mu$m, the concentration gradient is very high and the initial boron concentration is very low (considerably lower than 10$^{16}$ B/cm$^3$) at the proton stopping depth (2.4 $\mu$m). However, it is seen from curve II of FIG. 4 which gives the profile after irradiation that a very substantial enrichment (in relative value) and a peak in the vicinity of 3 μm are obtained between 2.2 μm and 4 μm.

All these examples clearly show that, by virtue of the method of doping according to the invention, it is possible to obtain inversion of the impurity concentration gradient in a zone adjacent to the zone of stopping of the particles employed in the irradiation process, this inversion being exhibited by the formation of a concentration peak if there is a non-homogeneous concentration of impurities.

In the event that a constant concentration is adopted at the outset, there is obtained a concentration peak preceded by a valley.

In other words, spreading of the initial concentration profile is obtained by means of the method of accelerated diffusion. On the contrary, a localized "enrichment" is obtained by means of the novel method of doping. It is therefore a fact that these two methods are entirely different from each other. The particles serve only to displace the impurities which are already present within the crystal.

In the examples given in the foregoing, only one irradiation operation was employed. It is readily apparent that in some cases it can be an advantage to carry out a number of irradiations with different energies and fluences in order to obtain for example a region having a broader peak.

The foregoing description related to the use of protons as "bombardment" particles in order to obtain displacement of impurities ; many other charged or uncharged particles can be employed such as molecules, atoms, ions. By way of example use could very readily be made of rare gases, atoms of silicon, carbon or germanium .

It is also possible to employ doping particles for the bombardment. The method described above is in that case combined with a conventional ion implantation effect.

Moveover, the initial doping is preferably but not exclusively carried out by means of hydrogenous impurities, that is to say impurities having an energy level of small depth. This applies in particular to the elements of columns III and V of the periodic table such as arsenic, phosphorus, boron and so forth.

A number of applications of the method of doping according to the invention will now be described.

Figure 5:
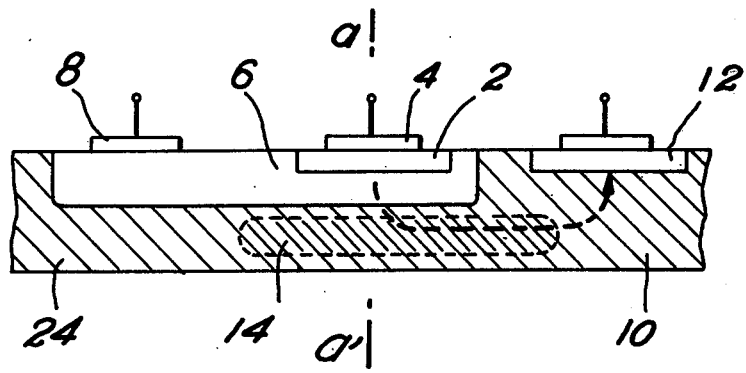
FIGS. 5 and 6 show one example of application of the method according to the invention to the fabrication of a bipolar transistor on solid silicon.
Figure 6:
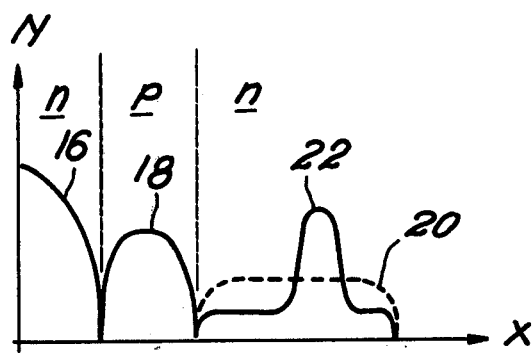

FIGS. 5 and 6 illustrate one example of application to the fabrication of a bipolar transistor on solid silicon.

FIG. 5 is a sectional view of a conventional bipolar transistor. There is shown the n-type region constituting the emitter 2 with its electrical contact 4, the p-type region forming the base 6 with its electrical contact 8 and the n-type region which forms the collector 10 with its $n^+$ type contact region 12, the unit as a whole being formed in a silicon layer formed by epitaxial growth. In order to reduce the resistance of access to the intrinsic collector, recourse can be had to heavy doping of the collector but this increases the stray collector-base capacitance and is liable to limit the performances of the circuit thus formed. In order to overcome this disadvantage, a heavily doped n-type buried region 14 is formed by the method of doping in accordance with the invention. The region 14 to be irradiated is defined by means of a mask of suitable shape and the energy of the proton beam and its fluence are adjusted so as to form the region 14.

FIG. 6 shows the concentration profiles along the section plane $a$–$a'$. The emitter and base profiles 16 and 18 are not modified. In the collector region, there was initially a constant concentration represented by dashed lines (20). After irradiation, the profile 22 is obtained. Provision is thus made for heavy doping in the region 14 and much lighter doping in the regions of contact with the base and the substrate 24. The stray base-collector and collector-substrate capacitance is therefore reduced in a single technological operation by maintaining the resistance of access to the collector at a constant value in a first approximation.

Similar problems arise in the case of silicon layers deposited on an insulating substrate whenever contacts are to be established within the volume. These problems can be solved by resorting to the method of doping in accordance with the invention.

By reason of the presence of surface states, a high recombination rate is observed in a structure of this type, especially at the insulating silicon interface. Various devices can be fabricated on these layers and it is desirable to be able to form a screen for the minority carriers with respect to said surface (minority carrier devices). This can be carried out by creating a high doping gradient and associating with this latter an electric field which repels the minority carriers.

FIGS. 7a, 7'a, 7b and 7'b illustrate the case of a $p^+$ $nn^+$ diode on an insulating substrate.

FIG. 7a is a sectional view showing a diode of this type.

There can be seen in this figure the insulating substrate 26, the $p^+$, n and $n^+$ regions designated respectively by the references 28, 30 and 32, and the insulating layer 34 (formed of silica, for example). The arrows show the diode current $I_D$ and the recombination currents $I_{R1}$ and $I_{R2}$ at the interfaces $I_1$ and $I_2$.

FIG. 7b shows the doping profile along the section plane $a$—$a$ which is uniform.

The same diode is shown in FIG. 7'a but is obtained in this case by the method according to the invention. This diode differs from that of FIG. 7a in the zone 36 of the n-type region 30 which is very heavily doped ; this is shown in FIG. 7'b. A heavily doped zone having a thickness $e$ is located in the vicinity of the insulating silicon interface. This doping can advantageously be obtained by means of the method according to the invention. The rate of recombination at the interface $I_2$ is higher than at the interface $I_1$ and the doping gradient at the interface $I_2$ produces an electric field $\epsilon$ within the silicon which repels the minority carriers and thus prevents substantial recombination at low injection levels.

When conventional technologies are adopted, this result cannot be obtained by retaining a very small thickness $e$ with respect to the thickness of the silicon layer. The same doping operation at the interface $I_1$ is carried out between the silicon and the silica layer.

The same technique can be applied to the fabrication of a lateral transistor of the silicon-on-insulator type. In this case, the regions of type $p^+$ $nn^+$ 28, 30 and 32 of FIG. 7'a are respectively replaced by regions of types $n^+$ $pn^+$ or $p^+$ $np^+$, depending on whether it is desired to obtain a p-type transistor or an n-type transistor.

In FIGS. 8a and 8b, there is shown a further example of application of the method according to the invention to the case of depletion MOS transistors.

FIG. 8a is a sectional view of a transistor of this type and shows $p^+$ type regions corresponding to the drain 38 and to the source 40 and the conducting channel 42.

The full-line curve (curve 1) of FIG. 8b shows the impurity concentration profile along the section plane a–a' obtained by means of an ion implantation technique. $N_{B1}$ doping is present in the vicinity of the surface of the semiconductor and $N_{B2}$ doping ($N_{B2} \gg N_{B1}$) is present at the center of the channel 42.

By employing the method of doping in accordance with the invention, there is obtained in the case of channel 42 the concentration profile shown in dashed lines (curve 2). This makes it possible to have much steeper profiles. By providing a better distribution of impurities within the channel, the maximum value $N_{52}$ and the surface mobility of the MOS transistor is thus improved. In order to obtain this profile, a number of bombardments are employed with different energies.

FIGS. 9a, 9b and 9c relate to the fabrication of a field-effect transistor with buried electrode. A first step consists in forming the structure shown in cross-section in FIG. 9a. The p-type pad 44 is formed by diffusion within the n-type substrate 46. FIG. 9b shows the curve 1 which gives the difference in concentrations of acceptors and of donors ($N_A$–$N_D$) as a function of the depth.

In order to fabricate the structure shown in FIG. 9c, that is to say in order to form the p-type buried electrode 48, the surface of the substrate corresponding to the pad 44 is irradiated by the method according to the invention. There is thus obtained the concentration profile represented by curve 2 of FIG. 9c.

In more general terms, the method of doping according to the invention makes it possible to form buried electrodes both readily and with a high degree of accuracy. The method accordingly finds a particularly advantageous application in the construction of photodiodes which are sensitive to a number of wavelengths of light.

It is in fact only necessary by means of this method to form buried electrodes at different depths in one and the same substrate (for example an n-type substrate).

What we claim is:

1. A method for improving the doping of a semiconductor material with impurities of a given conductivity type, wherein said method consists in a first step in doping said material with said impurities which have a given concentration profile and, in a second step, in maintaining said material at a high temperature, in bombarding said material with a beam of a constant intensity of particles accelerated with a constant energy which is sufficient to penetrate into the material during a given time interval so as to obtain migration of the impurities resulting in an increase in the impurity concentration irrespective of the sign of the initial concentration gradient within a zone adjacent to the zone of stopping of the particles, said zone being in a portion of said material which is doped with said impurity.

2. A method according to claim 1, wherein the energy of the beam of non-doping ions is such that the zone of stopping of said particles is adjacent to the region in which it is desired to obtain a rise in the impurity concentration gradient.

3. A method according to claim 1, wherein said particles are non-doping and the fluence of the beam is such that the desired value of the rise in the concentration gradient is obtained.

4. A method according to claim 1, wherein the acceleration energy is within the range of 200 to 700 keV.

5. A method according to claim 1, wherein the temperature is within the range of 700° to 1000° C.

6. A method according to claim 1, wherein the particles are selected from the group comprising the molecules, the atoms and the ions.

7. A method according to claim 6, wherein the particles are non-doping and are selected from the group comprising the protons and the molecular ions $H_2^+$.

8. A method according to claim 1, wherein the particles are doping in the case of the semiconductor material.

9. A method according to claim 1, wherein the particles are non-doping in the case of said semiconductor material.

10. A method according to claim 7, wherein the non-doping particles are protons and wherein the fluence of the proton beam is within the range of $10^{15}$ p/cm$^2$ and $10^{19}$ p/cm$^2$.

11. A method according to claim 1, wherein the doping impurities are selected from the elements which have an energy level of small depth.

12. A method according to claim 11, wherein the impurities are selected from the elements of columns III and V of the periodic table of elements.

13. A method according to claim 1, wherein the doping of the first step of said method is homogeneous.

14. A method according to claim 1, wherein the doping of the first step of said method has any concentration profile.

15. Application of the method according to claim 1 to the fabrication of a bipolar transistor, wherein said method consists in forming within the collector zone between the base and the collector contact a region having an impurity concentration which is higher than the concentration of the remainder of the collector zone.

16. Application of the method according to claim 1 to the fabrication of a diode on an insulating substrate, wherein said method consists in forming within the n-type region of said diode at the interface of said region with said substrate a thin zone having an impurity concentration which is higher than that of the remainder of said region.

17. Application of the method according to claim 1 to the fabrication of a depletion MOS transistor, wherein said method consists in forming in the zone of the conducting channel which separates the drain contact from the source contact a region which exhibits a very steep doping profile.

18. Application of the method according to claim 1 to the fabrication of a buried-electrode field-effect transistor, wherein said electrode is formed by means of said method.

19. A method according to claim 1, wherein said material is subjected to a plurality of said bombardment steps, each bombardment being with particles accelerated at a different energy, the energy being maintained constant throughout each bombardment.

20. A method of increasing the concentration of an impurity having a given conductivity type within a portion of a semiconductor material doped with said impurity comprising:
heating said material to an elevated temperature,
bombarding said heated material with a stream of particles,
maintaining the intensity of said beam constant throughout said bombardment,
maintaining the energy at which said particles are accelerated constant throughout said bombardment, said energy being at a sufficient level so that the zone in which said particles are stopped in said material is doped with said impurity.

21. A method according to claim 20 wherein said elevated temperature is between 700° to 1000° C, said particles are protons, said intensity is from $10^{15}$ p/cm$^2$ to $10^{19}$ p/cm$^2$, and said energy is from 200 to 700 keV.

* * * * *